US009106225B2

United States Patent
Teh et al.

(10) Patent No.: US 9,106,225 B2
(45) Date of Patent: Aug. 11, 2015

(54) SEMICONDUCTOR INTEGRATED CIRCUIT

(71) Applicant: KABUSHIKI KAISHA TOSHIBA, Minato-ku, Tokyo (JP)

(72) Inventors: Chen kong Teh, Tokyo (JP); Hiroyuki Hara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 13/948,778

(22) Filed: Jul. 23, 2013

(65) Prior Publication Data
US 2013/0307585 A1 Nov. 21, 2013

Related U.S. Application Data

(62) Division of application No. 12/722,837, filed on Mar. 12, 2010, now Pat. No. 8,519,743.

(30) Foreign Application Priority Data

Jul. 23, 2009 (JP) .................................. 2009-172278

(51) Int. Cl.
*H03K 19/096* (2006.01)
*H03K 3/289* (2006.01)
*H03K 3/356* (2006.01)

(52) U.S. Cl.
CPC ........ *H03K 19/096* (2013.01); *H03K 3/356156* (2013.01); *H03K 19/0963* (2013.01)

(58) Field of Classification Search
USPC ........ 326/93, 95; 327/202, 203, 210, 218, 99, 327/199; 716/134
See application file for complete search history.

(56) References Cited

U.S. PATENT DOCUMENTS

| 4,096,401 A * | 6/1978 | Hollingsworth ................ 327/57 |
| 4,506,167 A | 3/1985 | Little et al. |
| 4,939,384 A | 7/1990 | Shikata et al. |
| 5,654,659 A | 8/1997 | Asada |
| 6,864,732 B2 | 3/2005 | Chalasani |
| 7,109,772 B2 | 9/2006 | Tohsche |
| 7,196,550 B1 * | 3/2007 | Reinschmidt ................ 326/113 |
| 2004/0095175 A1 | 5/2004 | Chalasani |

FOREIGN PATENT DOCUMENTS

| JP | 62-040616 | 2/1987 |
| JP | 03-262317 | 11/1991 |
| JP | 09-232919 | 9/1997 |

(Continued)

OTHER PUBLICATIONS

Japanese Office Action for Japanese Application No. 200172278 mailed on Sep. 11, 2012.

(Continued)

*Primary Examiner* — Daniel D Chang
(74) *Attorney, Agent, or Firm* — White & Case LLP

(57) ABSTRACT

A semiconductor integrated circuit comprises a state holding circuit that inputs an output of one inverter to another inverter with each other; an input circuit that causes a state of the state holding circuit to transition based on a data signal; a first first-conductive transistor that is inserted between an input of the one inverter and an output of the another inverter and is controlled by the data signal; and a first second-conductive transistor that is connected in parallel with the first first-conductive transistor and is controlled by the data signal.

15 Claims, 12 Drawing Sheets

(56) References Cited

FOREIGN PATENT DOCUMENTS

| | | |
|---|---|---|
| JP | 09-232920 | 9/1997 |
| JP | 10-109416 | 7/1998 |

OTHER PUBLICATIONS

Japanese Office Action for Japanese Application No. 2009-172278 mailed on Sep. 11, 2012.

* cited by examiner

SEMICONDUCTOR INTEGRATED CIRCUIT

CROSS-REFERENCE TO THE RELATED APPLICATION

This application is based upon and claims the benefit of priority from the prior Japanese Patent Application No. 2009-172278, filed on Jul. 23, 2009; the entire contents of which are incorporated by reference herein. This application is a divisional of U.S. application Ser. No. 12/722,837, filed on Mar. 12, 2010.

BACKGROUND OF THE INVENTION

1. Field of the Invention

The present invention relates to a semiconductor integrated circuit, and is particularly suitably applied to a latch circuit or a flip-flop circuit that operates in synchronization with a clock signal.

2. Description of the Related Art

In a conventional flip-flop circuit, for example, data transfer and hold is performed by operating a clocked inverter by a clock signal and a clock inverted signal (Japanese Patent Application Laid-open No. S62-40816).

However, a clock buffer that generates the clock inverted signal from the clock signal is additionally needed, and power is consumed in the clock buffer at every clock transition, so that the power consumption increases by that amount. Specially, in the case of a low switching rate at which the output does not change even when being triggered by the clock, the power consumption in the clock buffer is wasteful.

BRIEF SUMMARY OF THE INVENTION

A semiconductor integrated circuit according to an embodiment of the present invention comprises: a state holding circuit that inputs an output of one inverter to another inverter with each other; an input circuit that causes a state of the state holding circuit to transition based on a data signal; a first first-conductive transistor that is inserted between an input of the one inverter and an output of the another inverter and is controlled by the data signal; and a first second-conductive transistor that is connected in parallel with the first first-conductive transistor and is controlled by the data signal.

A semiconductor integrated circuit according to an embodiment of the present invention comprises: a state holding circuit that holds two states by inputting an output of one inverter to another inverter with each other;

a first P-channel field-effect transistor that inputs a data signal to the one inverter of the state holding circuit when a clock signal is in a low level; a second P-channel field-effect transistor that inputs a inverted data signal to the another inverter of the state holding circuit when the clock signal is in a low level; a first N-channel field-effect transistor that transmits one state held in the state holding circuit when the clock signal is in a high level; and a second N-channel field-effect transistor that transmits another state held in the state holding circuit when the clock signal is in a high level.

A semiconductor integrated circuit according to an embodiment of the present invention comprises: a state holding circuit that holds two states by inputting an output of one inverter to another inverter with each other;

a first N-channel field-effect transistor that inputs a data signal to the one inverter of the state holding circuit when a clock signal is in a high level; a second N-channel field-effect transistor that inputs a inverted data signal to the another inverter of the state holding circuit when the clock signal is in a high level; a first P-channel field-effect transistor that transmits one state held in the state holding circuit when the clock signal is in a low level; and a second P-channel field-effect transistor that transmits another state held in the state holding circuit when the clock signal is in a low level.

DETAILED DESCRIPTION OF THE INVENTION

A semiconductor integrated circuit according to embodiments of the present invention is explained below with reference to the drawings. The present invention is not limited to these embodiments.

First Embodiment

Figure 1:
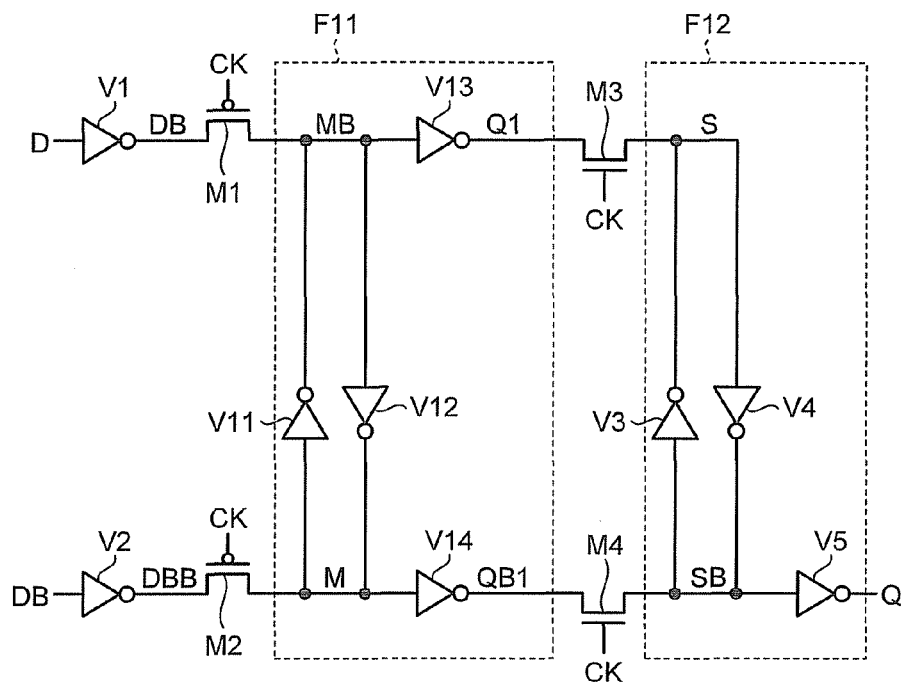
FIG. 1 is a circuit diagram illustrating a schematic configuration of a semiconductor integrated circuit according to a first embodiment of the present invention.

FIG. 1 is a circuit diagram illustrating a schematic configuration of a semiconductor integrated circuit according to the first embodiment of the present invention. The semiconductor integrated circuit shown in FIG. 1 includes a state-holding circuit F11 that holds two states (a logical value '0' and a logical value '1'), and the state-holding circuit F11 includes inverters V11 to V14. The output of the inverter V11 is connected to the input of the inverter V12 to constitute a storage node MB, and the output of the inverter V12 is connected to the input of the inverter V11 to constitute a storage node M. The storage node MB is connected to the input of the inverter V13, and the storage node M is connected to the input of the inverter V14.

A state-holding circuit F12 that holds two states (a logical value '0' and a logical value '1') is provided at the rear stage of the state-holding circuit F11 to constitute a master-slave flip-flop. The state-holding circuit F12 includes inverters V3 to V5. The output of the inverter V3 is connected to the input of the inverter V4 to constitute a storage node S, and the output of the inverter V4 is connected to the input of the inverter V3 to constitute a storage node SB. The storage node SB is connected to the input of the inverter V5 from which an output signal Q is output.

The semiconductor integrated circuit includes P-channel field-effect transistors (hereinafter, PMOS transistors) M1 and M2 and N-channel field-effect transistors (hereinafter, NMOS transistors) M3 and M4. The drain of the PMOS transistor M1 is connected to the storage node MB, and a data signal D is input to the source of the PMOS transistor M1 via the inverter V1. The drain of the PMOS transistor M2 is connected to the storage node M, and a inverted data signal DB is input to the source of the PMOS transistor M2 via the inverter V2.

Moreover, the drain of the NMOS transistor M3 is connected to the output of the inverter V13, and the source of the NMOS transistor M3 is connected to the storage node S. The drain of the NMOS transistor M4 is connected to the output of the inverter V14, and the source of the NMOS transistor M4 is connected to the storage node SB. A clock signal CK is input to each gate of the PMOS transistors M1 and M2 and the NMOS transistors M3 and M4.

When the clock signal CK is in a high level, the PMOS transistors M1 and M2 are off and the NMOS transistors M3 and M4 are on. In the state-holding circuit F11, the storage node MB is maintained in a low level when the storage node M is maintained in a high level, and the storage node MB is maintained in a high level when the storage node M is maintained in a low level.

Next, the operation in the present embodiment is explained. When the data signal D is input to the inverter V1, the inverted data signal DB is generated and is input to the source of the PMOS transistor M1 and the inverter V2. When the inverted data signal DB is input to the inverter V2, a data signal DBB is generated and is input to the source of the PMOS transistor M2.

Then, when the clock signal CK transitions from a high level to a low level, the PMOS transistors M1 and M2 are turned on. At this time, the inverted data signal DB is applied to the storage node MB via the PMOS transistor M1, the data signal DBB is applied to the storage node M via the PMOS transistor M2, and these states are held in the storage nodes MB and M.

Then, the state of the storage node MB is inverted in the inverter V13, so that an output signal Q1 is generated and is input to the drain of the NMOS transistor M3. Moreover, the state of the storage node M is inverted in the inverter V14, so that an output inverted signal QB1 is generated and is input to the drain of the NMOS transistor M4. At this time, the NMOS transistors M3 and M4 are off. Therefore, the state of the output signal Q in the state-holding circuit F12 does not change.

Next, when the clock signal CK transitions from a low level to a high level, the PMOS transistors M1 and M2 are turned off and the NMOS transistors M3 and M4 are turned on. When the NMOS transistors M3 and M4 are turned on, the output signal Q1 is applied to the storage node S via the NMOS transistor M3, the output inverted signal QB1 is applied to the storage node SB via the NMOS transistor M4, and these states are held in the storage nodes S and SB.

Then, the state held in the storage node SB is inverted in the inverter V5, so that the output signal Q is generated.

When the inverted data signal DB is in a high level and the storage node MB is in a low level, the storage node MB can be charged via the PMOS transistor M1. Moreover, when the inverted data signal DB is in a low level and the storage node MB is in a high level, the data signal DBB is in a high level and the storage node M is in a low level, so that the storage node M can be charged via the PMOS transistor M2.

Moreover, when the output signal Q1 is in a low level and the storage node S is in a high level, the storage node S can be discharged via the NMOS transistor M3. Furthermore, when the output signal Q1 is in a low level and the storage node S is in a high level, the output inverted signal QB1 is in a high level and the storage node SB is in a low level, so that the storage node SB can be charged via the NMOS transistor M4.

Furthermore, the inverted data signal DB and the data signal DBB are input to the storage nodes MB and M via the PMOS transistors M1 and M2, respectively, and the output signal Q1 and the output inverted signal QB1 are output via the NMOS transistors M3 and M4, respectively, thereby enabling to cause the state-holding circuit F11 to hold the state and to output the state held in the state-holding circuit F11 by inputting the clock signal CK to the gates of the PMOS transistors M1 and M2 and the gates of the NMOS transistors M3 and M4. Therefore, there is no need to additionally provide a clock buffer that generates a clock inverted signal CKB from the clock signal CK, so that the power consumption by the clock buffer can be reduced.

The driving capability of the inverters V11 and V12 can be made smaller than that of the inverters V13 and V14 so that the inversion of the states held in the storage nodes M, MB, S, and SB can be easily performed.

Moreover, in the above embodiment, explanation is given for the method in which the inverted data signal DB is applied to the storage node MB via the PMOS transistor M1 and the data signal DBB is applied to the storage node M via the PMOS transistor M2; however, the data signal DBB can be applied to the storage node MB via the PMOS transistor M1 and the inverted data signal DB can be applied to the storage node M via the PMOS transistor M2.

Figure 2:
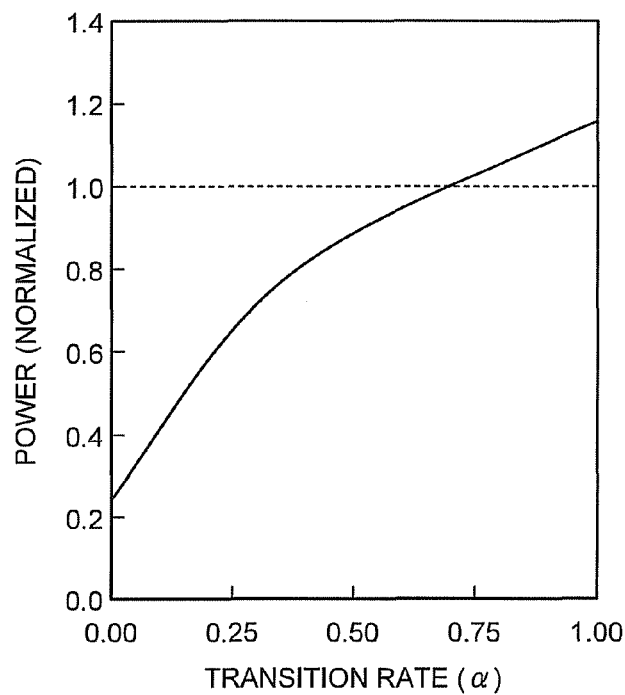
FIG. 2 is a diagram illustrating a relationship between a transition rate and a power consumption of the semiconductor integrated circuit shown in FIG. 1.

FIG. 2 is a diagram illustrating a relationship between a transition rate and a power consumption of the semiconductor integrated circuit shown in FIG. 1. In FIG. 2, when a transition rate $\alpha$ is 0.25, the power consumption can be reduced by about 40% compared with the method (FIG. 22 in Japanese Patent Application Laid-open No. S62-40816) in which the clock buffer that generates the clock inverted signal from the clock signal CK is additionally provided. Specially, in a typical LSI, the transition rate $\alpha$ is about 0.1, so that the power consumption can be reduced by about 60%. The transition rate $\alpha$ is a ratio of the number of changes of the output signal Q to the number of triggers by the clock signal CK.

Second Embodiment

Figure 3:
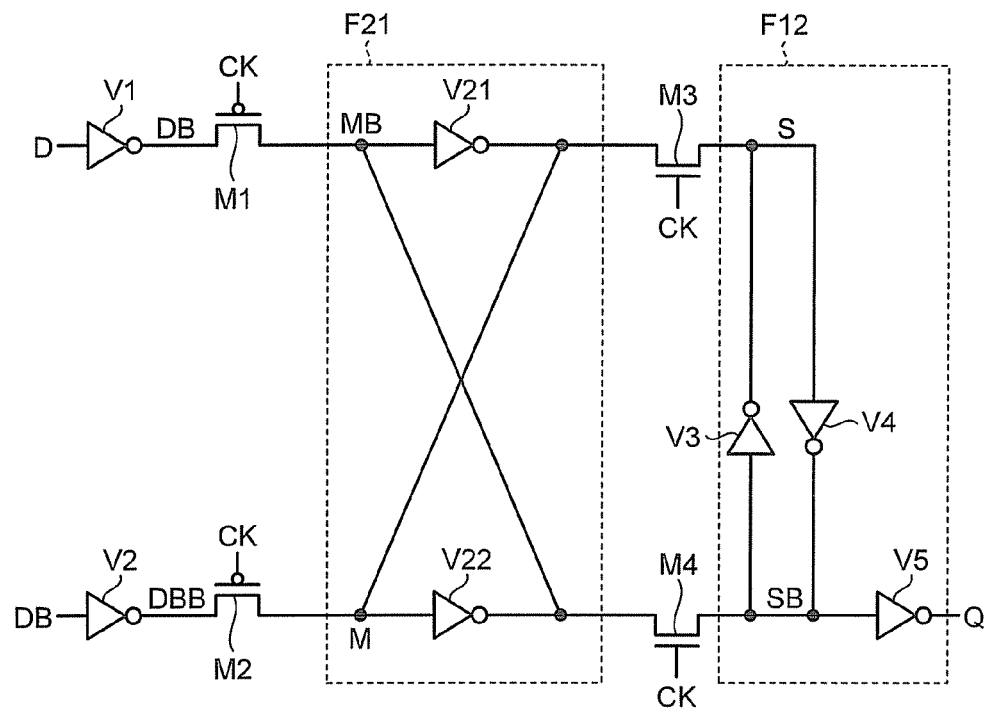
FIG. 3 is a circuit diagram illustrating a schematic configuration of a semiconductor integrated circuit according to a second embodiment of the present invention.

FIG. 3 is a circuit diagram illustrating a schematic configuration of a semiconductor integrated circuit according to the second embodiment of the present invention. The semiconductor integrated circuit shown in FIG. 3 includes a state-holding circuit F21 instead of the state-holding circuit F11 shown in FIG. 1. The state-holding circuit F21 includes inverters V21 and V22. The output of the inverter V21 is connected to the input of the inverter V22 to constitute the storage node M, and the output of the inverter V22 is connected to the input of the inverter V21 to constitute the storage node MB. The storage node MB is connected to the drain of the PMOS transistor M1 and the drain of the NMOS transistor M4. The storage node M is connected to the drain of the PMOS transistor M2 and the drain of the NMOS transistor M3.

The inverter V21 functions as both of the inverters V12 and V13 shown in FIG. 1, and the inverter V22 functions as both of the inverters V11 and V14 shown in FIG. 1. Therefore, the state-holding circuit F21 can reduce the number of the inverters compared with the state-holding circuit F11 shown in FIG. 1, and the effect similar to that in the first embodiment can be obtained.

Third Embodiment

Figure 4:
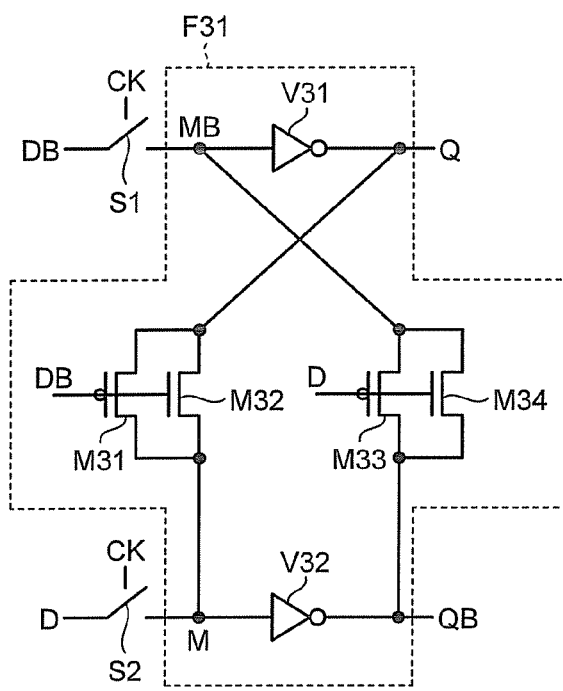
FIG. 4 is a circuit diagram illustrating a schematic configuration of a semiconductor integrated circuit according to a third embodiment of the present invention.

FIG. 4 is a circuit diagram illustrating a schematic configuration of a semiconductor integrated circuit according to the third embodiment of the present invention. The semiconductor integrated circuit shown in FIG. 4 includes a state-holding circuit F31 that holds two states. The state-holding circuit F31 includes inverters V31 and V32, PMOS transistors M31 and M33, and NMOS transistors M32 and M34.

The output of the inverter V31 is connected to the input of the inverter V32 via the PMOS transistor M31 and the NMOS transistor M32 that are connected in parallel to constitute the storage node M. The output of the inverter V32 is connected to the input of the inverter V31 via the PMOS transistor M33 and the NMOS transistor M34 that are connected in parallel to constitute the storage node MB.

The inverted data signal DB is input to the gate of the PMOS transistor M31 and the gate of the NMOS transistor M32, and the data signal D is input to the gate of the PMOS transistor M33 and the gate of the NMOS transistor M34. A switch S1 is connected to the input of the inverter V31, and a switch S2 is connected to the input of the inverter V32. The switches S1 and S2 are turned on/off in accordance with the clock signal CK, so that the data signal D and the inverted data signal DB are applied to the storage nodes MB and M.

When the data signal D is in a high level, the inverted data signal DB becomes a low level, so that the NMOS transistor M34 is turned on and the PMOS transistor M31 is turned on. On the other hand, when the data signal D is in a low level, the inverted data signal DB becomes a high level, so that the PMOS transistor M33 is turned on and the NMOS transistor M32 is turned on. Therefore, the output of the inverter V31 and the input of the inverter V32 are conducted and the output of the inverter V32 and the input of the inverter V31 are conducted in any state of the data signal D. Therefore, in the state-holding circuit F31, the storage node MB is maintained in a low level when the storage node M is maintained in a high level, and the storage node MB is maintained in a high level when the storage node M is maintained in a low level.

Then, when the switches S1 and S2 are on, the inverted data signal DB is applied to the storage node MB and the data signal D is applied to the storage node M. Then, the states of the storage nodes MB and M change in accordance with the levels of the inverted data signal DB and the data signal D, and these states are held in the storage nodes MB and M. The states held in the storage nodes MB and M are inverted in the inverters V31 and V32, respectively, and are output as the output inverted signal QB and the output signal Q.

The present circuit utilizes the characteristics of the PMOS transistor and the NMOS transistor shown in Table 1.

TABLE 1

|  | DISCHARGING CHARACTERISTICS | CHARGING CHARACTERISTICS |
| --- | --- | --- |
| NMOS TRANSISTOR | STRONG/COMPLETE (VSS) | WEAK/INCOMPLETE (VDD – Vnh) |
| PMOS TRANSISTOR | WEAK/INCOMPLETE (VSS + Vph) | STRONG/COMPLETE (VDD) |

In the case where the PMOS transistors M31 and M33 are on, when a high-level potential VDD is applied to the source, the drain also becomes the high-level potential VDD. On the contrary, when a low-level potential VSS is applied to the drain, the source rises by a threshold voltage Vph of the PMOS transistors M31 and M33 from the low-level potential VSS.

On the other hand, in the case where the NMOS transistors M32 and M34 are on, when the low-level potential VSS is applied to the source, the drain also becomes the low-level potential VSS. On the contrary, when the high-level potential VDD is applied to the drain, the source drops by a threshold voltage Vnh of the NMOS transistors M32 and M34 from the high-level potential VDD.

When the inverted data signal DB is in a high level, the storage node MB is in a low level, and when the data signal D is in a low level, the storage node M is in a high level. At this time, the PMOS transistor M33 and the NMOS transistor M32 are on.

Therefore, the holding capacity of a high level in the storage node M decreases in the NMOS transistor M32, and when the data signal D applied to the storage node M becomes a low level, the state held in the storage node M can be easily transitioned from a high level to a low level. Moreover, the holding capacity of a low level in the storage node MB decreases in the PMOS transistor M33, and when the inverted data signal DB applied to the storage node MB becomes a high level, the state held in the storage node MB can be easily transitioned from a low level to a high level. Thus, the present circuit increases the operable power-supply voltage margin, so that robustness of the circuit can be improved.

On the other hand, when the inverted data signal DB is in a low level, the storage node MB is in a high level, and when the data signal D is in a high level, the storage node M is in a low level. At this time, the NMOS transistor M34 and the PMOS transistor M31 are turned on.

Therefore, the holding capacity of a low level in the storage node M decreases in the PMOS transistor M31, and when the data signal D applied to the storage node M becomes a high level, the state held in the storage node M can be easily transitioned from a low level to a high level. Moreover, the holding capacity of a high level in the storage node MB decreases in the NMOS transistor M34, and when the inverted data signal DB applied to the storage node MB becomes a low level, the state held in the storage node MB can be easily transitioned from a high level to a low level. Thus, the present circuit increases the operable power-supply voltage margin, so that robustness of the circuit can be improved.

Fourth Embodiment

Figure 5:
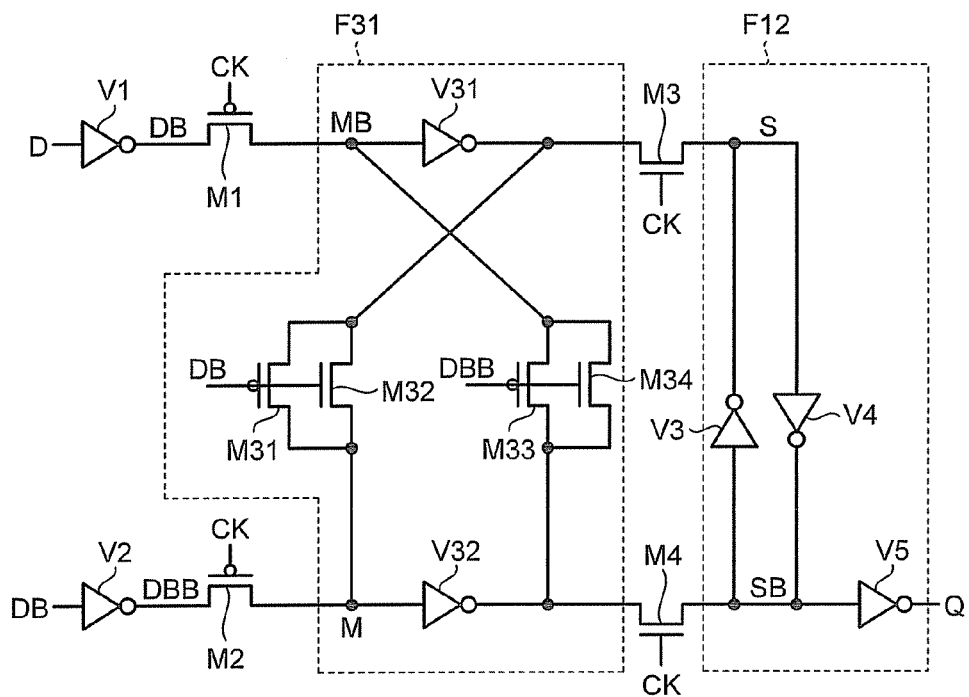
FIG. 5 is a circuit diagram illustrating a schematic configuration of a semiconductor integrated circuit according to a fourth embodiment of the present invention.

FIG. 5 is a circuit diagram illustrating a schematic configuration of a semiconductor integrated circuit according to the fourth embodiment of the present invention. In the semiconductor integrated circuit shown in FIG. 5, the state-holding circuit F11 shown in FIG. 1 is replaced by the state-holding circuit F31 shown in FIG. 4 to constitute a master-slave flip-flop.

The states held in the storage nodes M and MB can be easily transitioned by using the state-holding circuit F31 instead of the state-holding circuit F11, enabling to increase the operable power-supply voltage margin.

Figure 6:
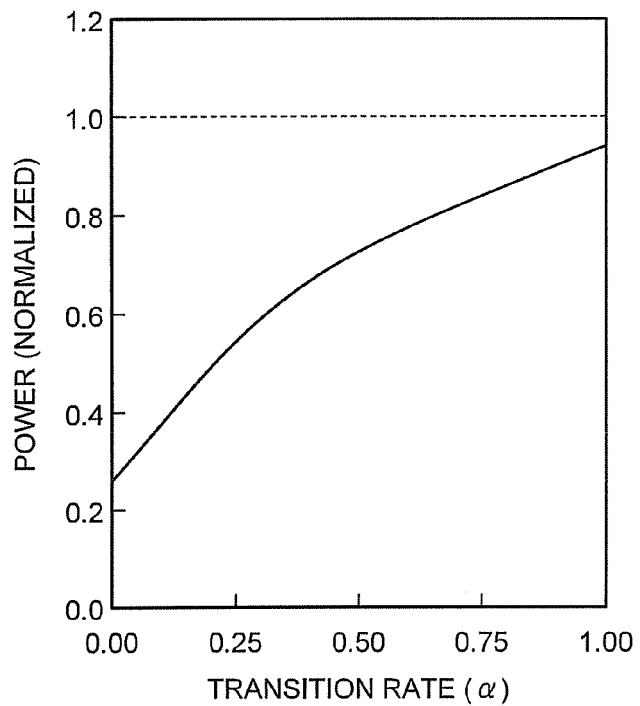
FIG. 6 is a diagram illustrating a relationship between a transition rate and a power consumption of the semiconductor integrated circuit shown in FIG. 5.

FIG. 6 is a diagram illustrating a relationship between the transition rate and the power consumption of the semiconductor integrated circuit shown in FIG. 5. In FIG. 6, when the transition rate α is 0.25, the power consumption can be reduced by about 40% compared with the method (FIG. 22 in Japanese Patent Application Laid-open No. S62-40816) in which the clock buffer that generates the clock inverted signal from the clock signal CK is additionally provided. Specially, in a typical LSI, the transition rate α is about 0.1, so that the power consumption can be reduced by about 60%. Moreover, in the circuit shown in FIG. 22 in Japanese Patent Application Laid-open No. S62-40816, the cell length is 21 grids, whereas the cell length is 19 grids in the semiconductor integrated circuit shown in FIG. 5, so that the design area can be made small.

Fifth Embodiment

Figure 7:
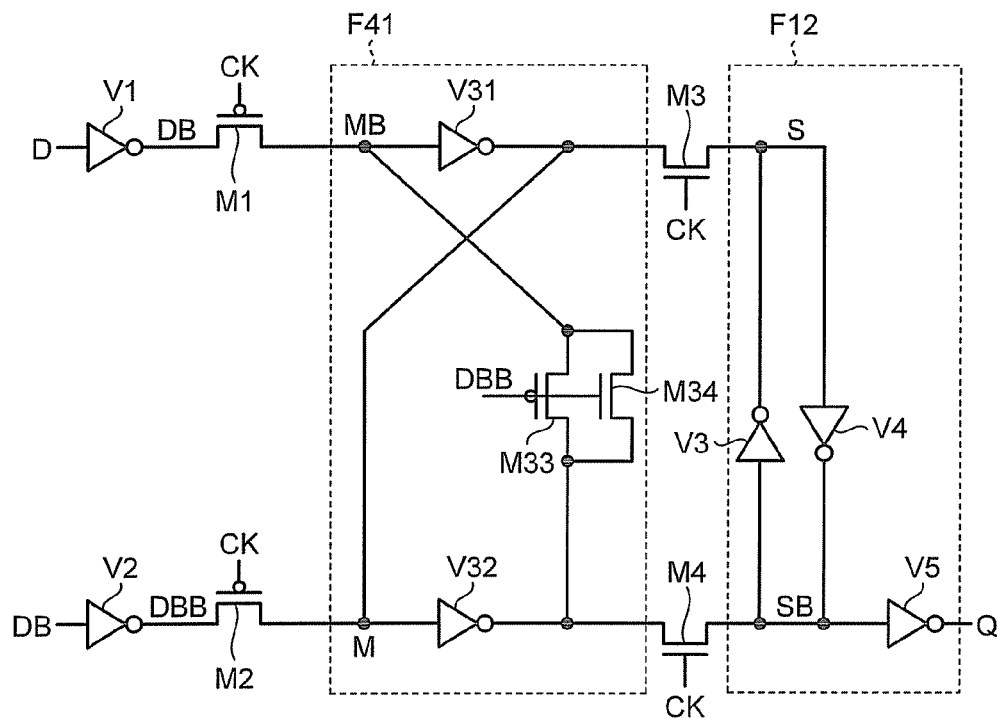
FIG. 7 is a circuit diagram illustrating a schematic configuration of a semiconductor integrated circuit according to a fifth embodiment of the present invention.

FIG. 7 is a circuit diagram illustrating a schematic configuration of a semiconductor integrated circuit according to the fifth embodiment of the present invention. In the semiconductor integrated circuit shown in FIG. 7, the state-holding circuit F31 shown in FIG. 5 is replaced by a state-holding circuit F41. In the state-holding circuit F41, the PMOS transistor M31 and the NMOS transistor M32 shown in FIG. 5 are not provided and the output of the inverter V31 is directly connected to the input of the inverter V32.

The data signal DBB is generated by inverting the inverted data signal DB in the inverter V2, so that the state change of the data signal DBB is delayed by the delay time by the inverter V2 from the state change of the inverted data signal DB. Therefore, the state change of the data signal D is transmitted to the storage node MB before the storage node M, and the state of the state-holding circuit F41 is determined in accordance with the state change of the storage node MB. Consequently, even when the PMOS transistor M31 and the NMOS transistor M32 shown in FIG. 5 are not provided in the state-holding circuit F41, the states held in the storage nodes M and MB can be easily transitioned.

Sixth Embodiment

Figure 8:
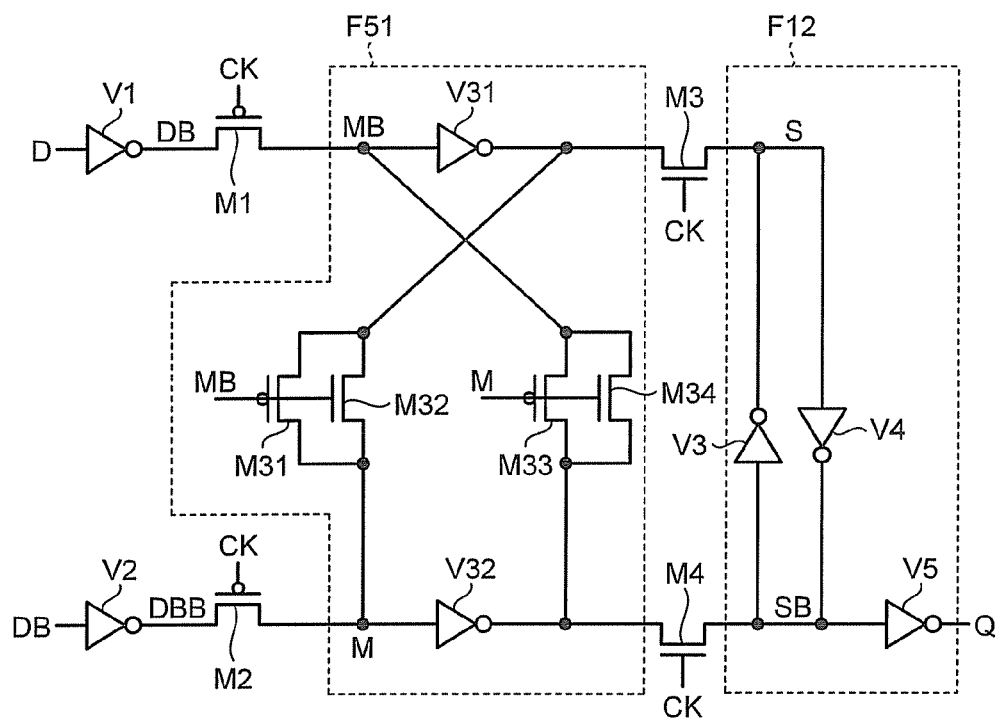
FIG. 8 is a circuit diagram illustrating a schematic configuration of a semiconductor integrated circuit according to a sixth embodiment of the present invention.

FIG. 8 is a circuit diagram illustrating a schematic configuration of a semiconductor integrated circuit according to the sixth embodiment of the present invention. In the semiconductor integrated circuit shown in FIG. 8, the state-holding circuit F31 shown in FIG. 5 is replaced by a state-holding circuit F51. In the state-holding circuit F51, the gate of the PMOS transistor M31 and the gate of the NMOS transistor M32 are connected to the storage node MB, and the gate of the PMOS transistor M33 and the gate of the NMOS transistor M34 are connected to the storage node M.

When the PMOS transistors M1 and M2 are turned on, the inverted data signal DB is applied to the storage node MB and the data signal DBB is applied to the storage node M, so that the states held in the storage nodes M and MB can be easily transitioned similar to the third embodiment.

Seventh Embodiment

Figure 9:
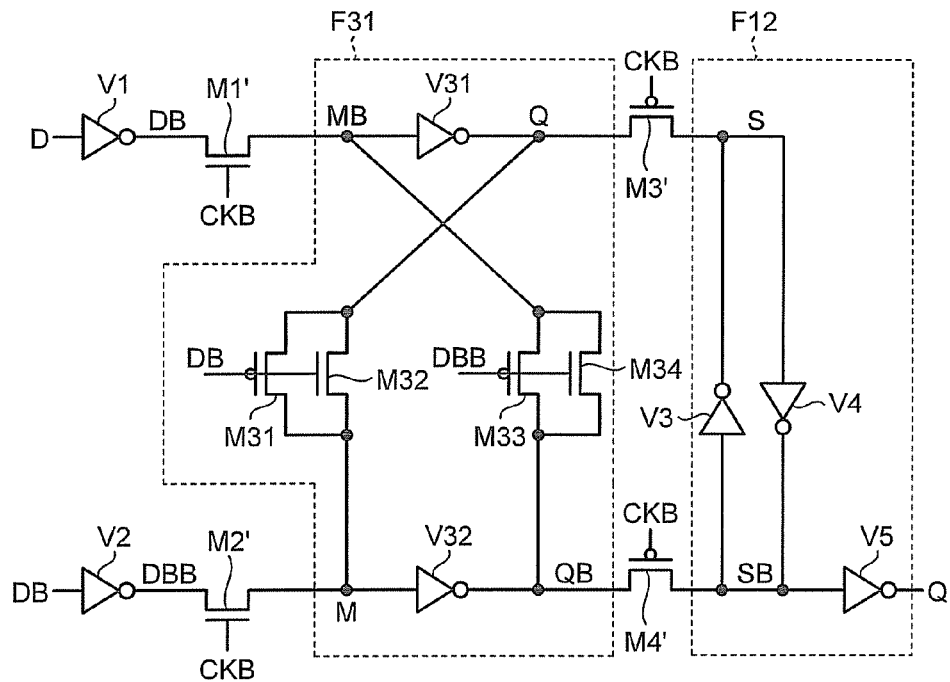
FIG. 9 is a circuit diagram illustrating a schematic configuration of a semiconductor integrated circuit according to a seventh embodiment of the present invention.

FIG. 9 is a circuit diagram illustrating a schematic configuration of a semiconductor integrated circuit according to the seventh embodiment of the present invention. In the semiconductor integrated circuit shown in FIG. 9, the PMOS transistors M1 and M2 shown in FIG. 5 are replaced by NMOS transistors M1' and M2' and the NMOS transistors M3 and M4 shown in FIG. 5 are replaced by PMOS transistors M3' and M4'. A clock signal CKB is input to the gates of the NMOS transistors M1' and M2' and the gates of the PMOS transistors M3' and M4'. The circuit shown in FIG. 5 triggers at the rising edge of the clock signal CK, whereas this circuit triggers at the falling edge of the clock signal CKB.

Then, the inverted data signal DB and the data signal DBB are input to the storage nodes MB and M via the NMOS transistors M1' and M2', respectively, and the output signal Q1 and the output inverted signal QB1 are output via the PMOS transistors M3' and M4', respectively. Whereby, it is possible to cause the state-holding circuit F31 to hold or transfer the state by inputting the clock signal CKB in the gates of the NMOS transistors M1' and M2' and the gates of the PMOS transistors M3' and M4'.

Eighth Embodiment

Figure 10:
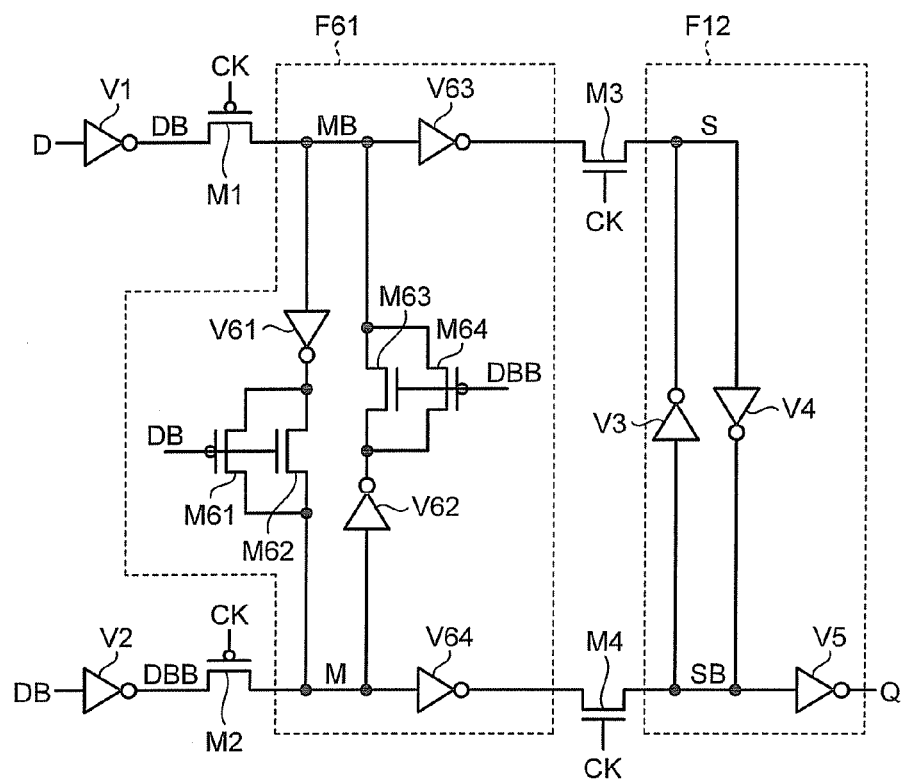
FIG. 10 is a circuit diagram illustrating a schematic configuration of a semiconductor integrated circuit according to an eighth embodiment of the present invention.

FIG. 10 is a circuit diagram illustrating a schematic configuration of a semiconductor integrated circuit according to the eighth embodiment of the present invention. In the semiconductor integrated circuit shown in FIG. 10, the state-holding circuit F31 shown in FIG. 5 is replaced by a state-holding circuit F61. The state-holding circuit F61 includes inverters V61 to V64, PMOS transistors M61 and M64, and NMOS transistors M62 and M63.

The output of the inverter V61 is connected to the input of the inverter V62 via the PMOS transistor M61 and the NMOS transistor M62 that are connected in parallel to constitute the storage node M. The output of the inverter V62 is connected to the input of the inverter V61 via the PMOS transistor M64 and the NMOS transistor M63 that are connected in parallel to constitute the storage node MB. The inverted data signal DB is input to each gate of the PMOS transistor M61 and the NMOS transistor M62, and the data signal DBB is input to each gate of the PMOS transistor M64 and the NMOS transistor M63.

The storage node MB is connected to the drain of the PMOS transistor M1 and is connected to the drain of the NMOS transistor M3 via the inverter V63. The storage node M is connected to the drain of the PMOS transistor M2 and is connected to the drain of the NMOS transistor M4 via the inverter V64.

The inverters V61 and V62 in the eighth embodiment perform the data hold by the inverters V31 and V32 shown in FIG. 5, and the inverters V63 and V64 perform the data transmission by the inverters V31 and V32 shown in FIG. 5. The eighth embodiment can also obtain the effect similar to that in the third embodiment.

Ninth Embodiment

Figure 11:
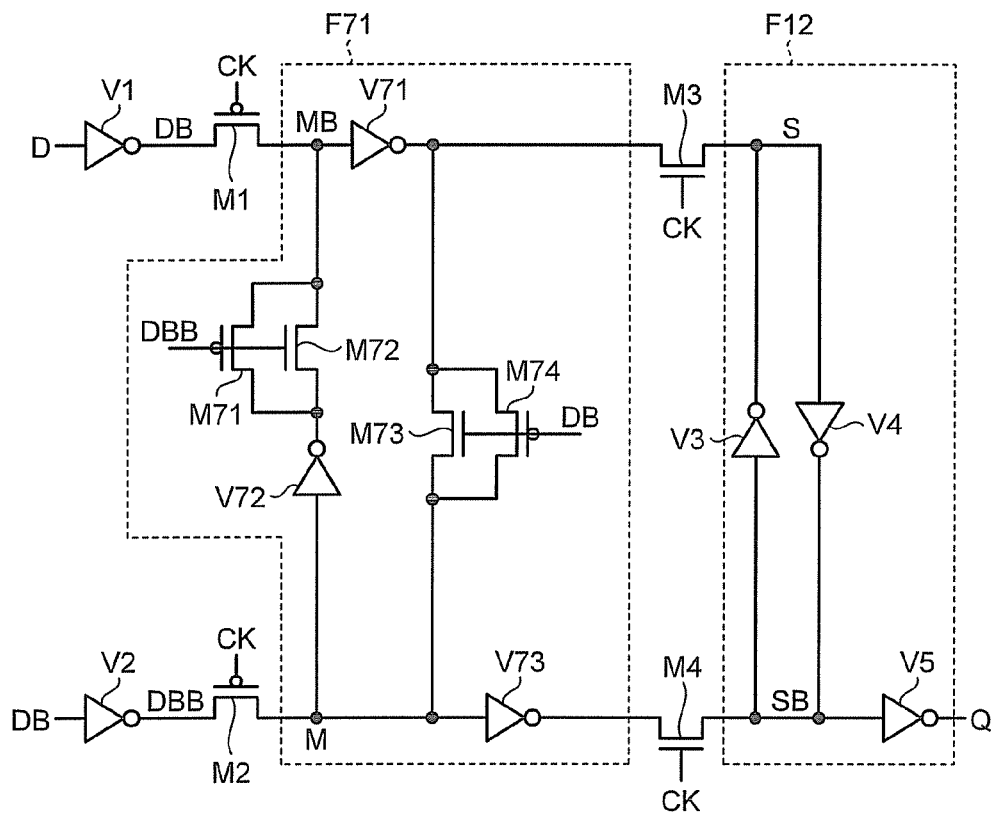
FIG. 11 is a circuit diagram illustrating a schematic configuration of a semiconductor integrated circuit according to a ninth embodiment of the present invention.

FIG. 11 is a circuit diagram illustrating a schematic configuration of a semiconductor integrated circuit according to the ninth embodiment of the present invention. In the semiconductor integrated circuit shown in FIG. 11, the state-holding circuit F31 shown in FIG. 5 is replaced by a state-holding circuit F71. The state-holding circuit F71 includes inverters V71 to V73, PMOS transistors M71 and M74, and NMOS transistors M72 and M73.

The output of the inverter V71 is connected to the input of the inverter V72 via the PMOS transistor M74 and the NMOS transistor M73 that are connected in parallel to constitute the storage node M. The output of the inverter V72 is connected to the input of the inverter V71 via the PMOS transistor M71 and the NMOS transistor M72 that are connected in parallel to constitute the storage node MB. The data signal DBB is input to each gate of the PMOS transistor M71 and the NMOS transistor M72, and the inverted data signal DB is input to each gate of the PMOS transistor M74 and the NMOS transistor M73.

The storage node MB is connected to the drain of the PMOS transistor M1 and is connected to the drain of the NMOS transistor M3 via the inverter V71. Moreover, the storage node M is connected to the drain of the PMOS transistor M2 and is connected to the drain of the NMOS transistor M4 via the inverter V73.

The inverter V71 performs the data hold and transmission by the inverter V31 shown in FIG. 5, the inverter V72 performs the data hold by the inverter V32 shown in FIG. 5, and the inverter V73 performs the data transmission by the inverter V32 shown in FIG. 5. The ninth embodiment can also obtain the effect similar to that in the third embodiment.

Tenth Embodiment

Figure 12:
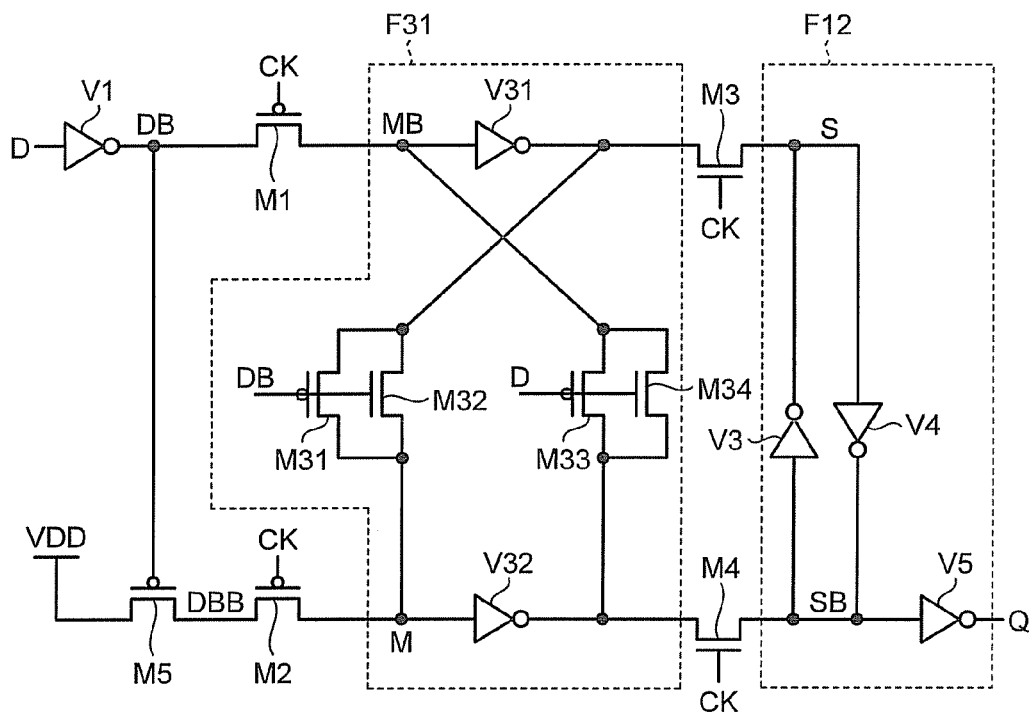
FIG. 12 is a circuit diagram illustrating a schematic configuration of a semiconductor integrated circuit according to a tenth embodiment of the present invention.

FIG. 12 is a circuit diagram illustrating a schematic configuration of a semiconductor integrated circuit according to the tenth embodiment of the present invention. In the semiconductor integrated circuit shown in FIG. 12, the inverter V2 shown in FIG. 5 is replaced by a PMOS transistor M5. The inverted data signal DB is input to the gate of the PMOS transistor M5. The source of the PMOS transistor M5 is connected to the high-level potential VDD and the drain of the PMOS transistor M5 is connected to the storage node M via the PMOS transistor M2.

When the inverted data signal DB is in a low level, the PMOS transistor M5 is turned on and the data signal DBB becomes a high level. Then, when the storage node MB is in a high level and the storage node M is in a low level, the storage node M is charged via the PMOS transistors M2 and M5. Therefore, the state-holding circuit F31 can be operated.

Eleventh Embodiment

Figure 13:
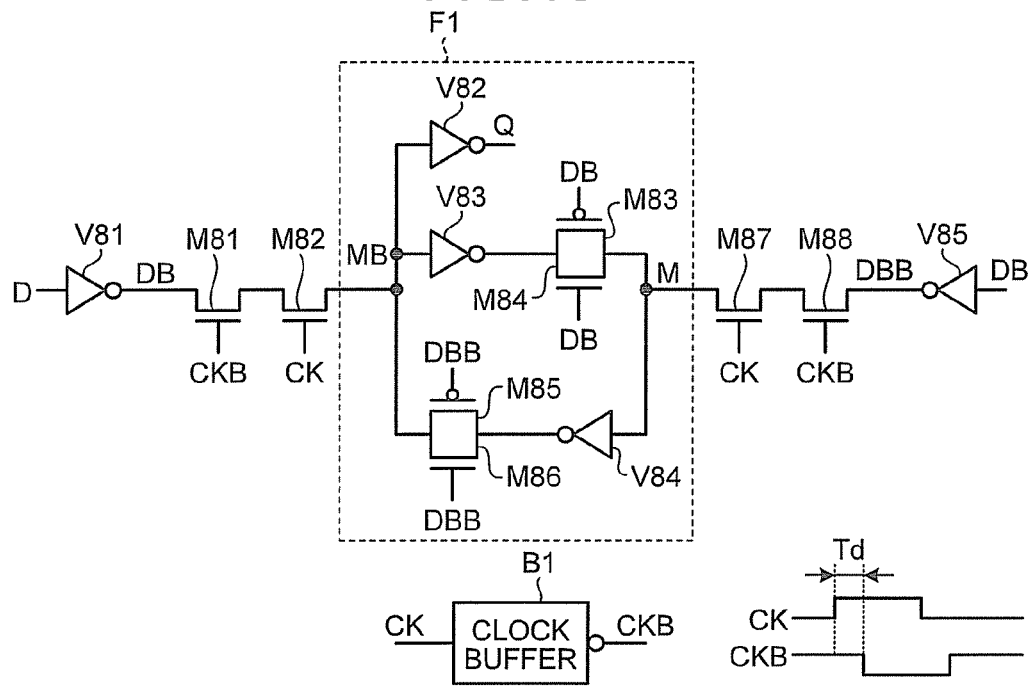
FIG. 13 is a circuit diagram illustrating a schematic configuration of a semiconductor integrated circuit according to an eleventh embodiment of the present invention.

FIG. 13 is a circuit diagram illustrating a schematic configuration of a semiconductor integrated circuit according to the eleventh embodiment of the present invention. The semiconductor integrated circuit shown in FIG. 13 includes a state-holding circuit F1 that holds two states, and the state-holding circuit F1 includes inverters V82 to V84, PMOS transistors M83 and M85, and NMOS transistors M84 and M86.

The output of the inverter V83 is connected to the input of the inverter V84 via the PMOS transistor M83 and the NMOS transistor M84 that are connected in parallel to constitute the storage node M. The output of the inverter V84 is connected to the input of the inverter V83 via the PMOS transistor M85 and the NMOS transistor M86 that are connected in parallel to constitute the storage node MB. The inverted data signal DB is input to each gate of the PMOS transistor M83 and the NMOS transistor M84, and the data signal DBB is input to each gate of the PMOS transistor M85 and the NMOS transistor M86. The storage node MB is connected to the input of the inverter V82.

Moreover, the semiconductor integrated circuit includes NMOS transistors M81, M82, M87, and M88. The NMOS transistors M81 and M82 are connected in series and the NMOS transistors M87 and M88 are connected in series. The storage node MB is connected to the output of the inverter V81 via the NMOS transistors M81 and M82. The storage node M is connected to the output of the inverter V85 via the NMOS transistors M87 and M88.

The clock signal CK is input to the gates of the NMOS transistors M82 and M87, and a inverted delayed clock signal CKB is input to the gates of the NMOS transistors M81 and M88. The inverted delayed clock signal CKB can be generated by delaying and inverting the clock signal CK in a clock buffer B1. The state change of the inverted delayed clock signal CKB is delayed by a delay time Td of the clock buffer B1 from the state change of the clock signal CK.

When the data signal D is input to the inverter V81, the inverted data signal DB is generated and is input to the source of the NMOS transistor M81 and the inverter V85. When the inverted data signal DB is input to the inverter V85, the data signal DBB is generated and is input to the source of the NMOS transistor M88.

Then, when the clock signal CK transitions from a low level to a high level, the inverted delayed clock signal CKB transitions from a high level to a low level after the delay time Td, so that the NMOS transistors M81, M82, M87, and M88 are all turned on only during the delay time Td.

When the NMOS transistors M81, M82, M87, and M88 are all turned on, the inverted data signal DB is applied to the storage node MB and the data signal DBB is applied to the storage node M. Then, the states of the storage nodes MB and M are held in accordance with the levels of the inverted data signal DB and the data signal DBB. Then, the state held in the storage node MB is inverted in the inverter V82 and is output as the output signal Q.

A parallel circuit of the PMOS transistor M83 and the NMOS transistor M84 is connected between the output of the inverter V83 and the input of the inverter V84, and a parallel circuit of the PMOS transistor M85 and the NMOS transistor M86 is connected between the output of the inverter V84 and the input of the inverter V83, so that the states held in the storage nodes M and MB can be easily transitioned and the operable power-supply voltage margin can be increased.

Twelfth Embodiment

Figure 14:
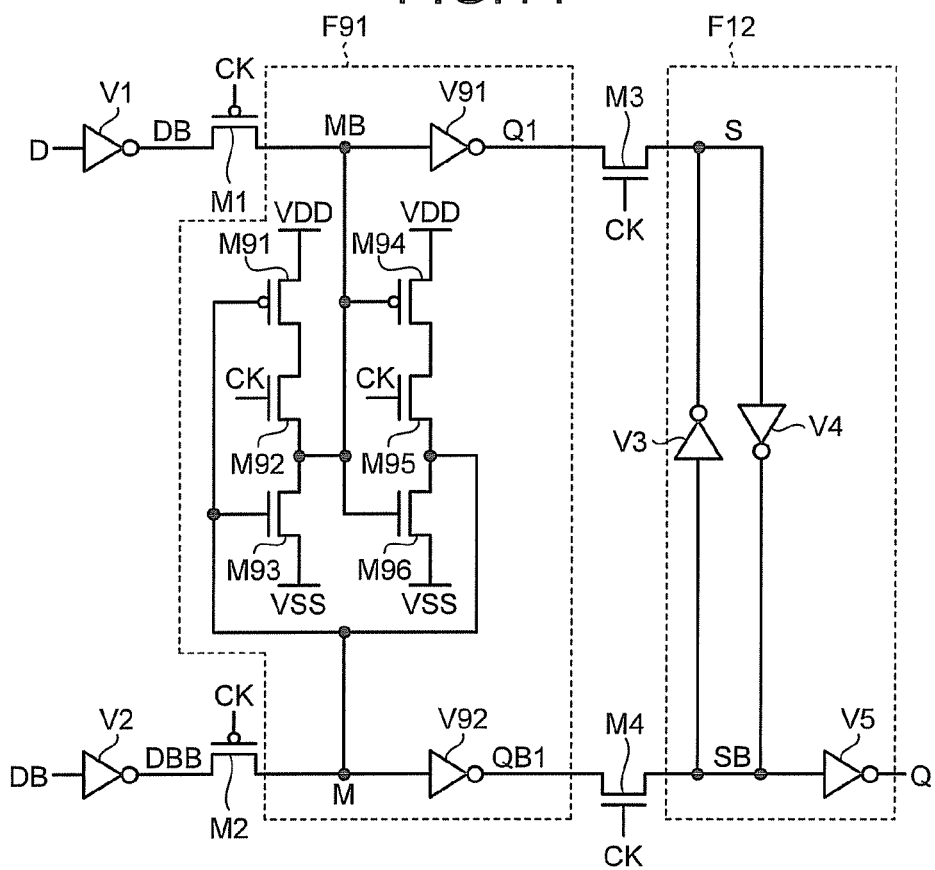
FIG. 14 is a circuit diagram illustrating a schematic configuration of a semiconductor integrated circuit according to a twelfth embodiment of the present invention.

FIG. 14 is a circuit diagram illustrating a schematic configuration of a semiconductor integrated circuit according to the twelfth embodiment of the present invention. In the semiconductor integrated circuit shown in FIG. 14, the state-holding circuit F31 shown in FIG. 5 is replaced by a state-holding circuit F91. The state-holding circuit F91 includes inverters V91 and V92, PMOS transistors M91 and M94, and NMOS transistors M92, M93, M95, and M96.

The PMOS transistor M91 and the NMOS transistors M92 and M93 are connected in series, and the PMOS transistor M94 and the NMOS transistors M95 and M96 are connected in series, between VDD-VSS. The gate of the PMOS transistor M94 and the gate of the NMOS transistor M96 are connected to the connection point of the NMOS transistors M92 and M93 to constitute the storage node MB. The gate of the PMOS transistor M91 and the gate of the NMOS transistor M93 are connected to the connection point of the NMOS transistors M95 and M96 to constitute the storage node M. The clock signal CK is input to the gates of the NMOS transistors M92 and M95.

The storage node MB is connected to the drain of the PMOS transistor M1 and is connected to the drain of the NMOS transistor M3 via the inverter V91. The storage node M is connected to the drain of the PMOS transistor M2 and is connected to the drain of the NMOS transistor M4 via the inverter V92.

When the clock signal CK is in a low level, the NMOS transistors M92 and M95 are off. Therefore, the storage nodes M and MB are both disconnected from the high-level potential VDD, so that the potentials of the storage nodes M and MB become undetermined.

On the other hand, when the clock signal CK is in a low level, the PMOS transistors M1 and M2 are on. Therefore, the inverted data signal DB is applied to the storage node MB and the data signal DBB is applied to the storage node M, so that the potential of the storage node MB is uniquely determined in accordance with the level of the inverted data signal DB and the potential of the storage node M is uniquely determined in accordance with the level of the data signal DBB.

Then, when the clock signal CK transitions from a low level to a high level, the NMOS transistors M3, M4, M92, and M95 are turned on. Therefore, any one of the storage nodes M and MB is connected to the high-level potential VDD in accordance with the levels of the data signal DBB and the inverted data signal DB, and the states in accordance with the levels of the data signal DBB and the inverted data signal DB are held in the storage nodes MB and M.

The states held in the storage nodes MB and M are inverted in the inverters V91 and V92, respectively, and are output as the output signal Q1 and the output inverted signal QB1 to the storage nodes S and SB via the NMOS transistors M3 and M4, respectively.

The holding capability of the states in the storage nodes M and MB can be lowered while the data signal DBB and the inverted data signal DB are applied to the storage nodes M and MB by the NMOS transistors M92 and M95, respectively, so that the states held in the storage nodes M and MB can be easily transitioned.

Moreover, the clock signal CK is input to the gates of the PMOS transistors M1 and M2 and the gates of the NMOS transistors M3, M4, M92, and M95, so that it is possible to cause the state-holding circuit F91 to hold or transfer the state. Therefore, there is no need to additionally provide a clock buffer that generates the clock inverted signal CKB from the clock signal CK, so that the power consumption can be reduced by the amount consumed by the clock buffer.

In the present embodiment in FIG. 14, explanation is given for the method in which the NMOS transistor M92 is inserted between the PMOS transistor M91 and the NMOS transistor M93 that constitutes the inverter; however, the NMOS transistor M92 can be inserted between the high-level potential VDD and the PMOS transistor M91.

Moreover, in the present embodiment in FIG. 14, explanation is given for the method in which the NMOS transistor M95 is inserted between the PMOS transistor M94 and the NMOS transistor M96 that constitutes the inverter; however, the NMOS transistor M95 can be inserted between the high-level potential VDD and the PMOS transistor M94.

Thirteenth Embodiment

Figure 15:
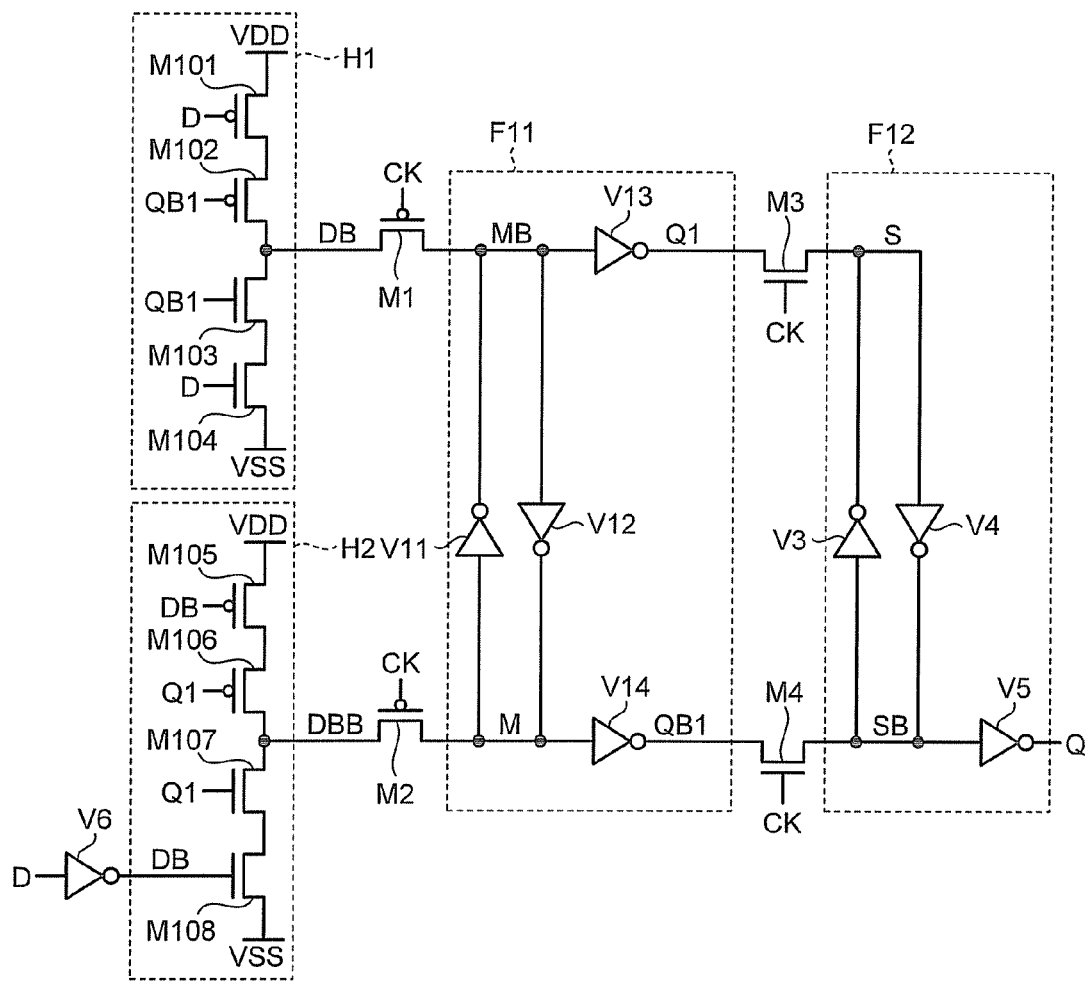
FIG. 15 is a circuit diagram illustrating a schematic configuration of a semiconductor integrated circuit according to a thirteenth embodiment of the present invention.

FIG. 15 is a circuit diagram illustrating a schematic configuration of a semiconductor integrated circuit according to the thirteenth embodiment of the present invention. In the semiconductor integrated circuit shown in FIG. 15, protection circuits H1 and H2 and an inverter V6 are provided instead of the inverters V1 and V2 shown in FIG. 1. The protection circuits H1 and H2 can control input of the inverted data signal DB and the data signal DBB to the state-holding circuit F11 based on the state held in the state-holding circuit F11.

The protection circuit H1 includes PMOS transistors M101 and M102 and NMOS transistors M103 and M104. These transistors M101 to M104 are connected in series between VDD-VSS and the connection point of the PMOS transistor M102 and the NMOS transistor M103 is connected to the source of the PMOS transistor M1. The data signal D is input to each gate of the PMOS transistor M101 and the NMOS transistor M104, and the output inverted signal QB1 is input to each gate of the PMOS transistor M102 and the NMOS transistor M103.

The protection circuit H2 includes PMOS transistors M105 and M106 and NMOS transistors M107 and M108. These transistors M105 to M108 are connected in series between VDD-VSS and the connection point of the PMOS transistor M106 and the NMOS transistor M107 is connected to the source of the PMOS transistor M2. The inverted data signal DB is input to each gate of the PMOS transistor M105 and the NMOS transistor M108, and the output signal Q1 is input to each gate of the PMOS transistor M106 and the NMOS transistor M107. The gate of the NMOS transistor M108 is connected to the output of the inverter V6.

The data signal D is input to the inverter V6, so that the inverted data signal DB is generated.

Figure 16:
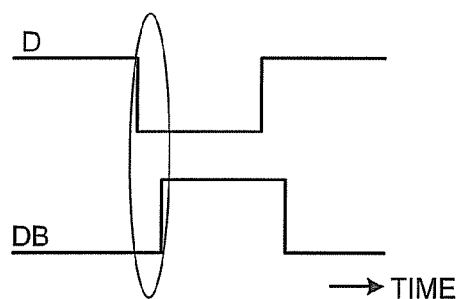
FIG. 16 is a diagram illustrating a timing difference in a state change between a data signal D and a inverted data signal DB.

FIG. 16 is a diagram illustrating a timing difference in the state change between the data signal D and the inverted data signal DB. In FIG. 16, the inverted data signal DB is generated by inverting the data signal D in the inverter V6, so that the state change of the inverted data signal DB is delayed by the delay time by the inverter V6 from the state change of the data signal D.

Therefore, even when the PMOS transistors M101 and M105 are turned on at the same time due to the timing difference in the state change between the data signal D and the inverted data signal DB, it is possible to prevent the charging paths to the storage nodes MB and M from being formed at the same time. Moreover, even when the NMOS transistors M104 and M108 are turned on at the same time, it is possible to prevent the discharging paths from the storage nodes MB and M from being formed at the same time.

Consequently, even when there is the timing difference in the state change between the data signal D and the inverted data signal DB, it is possible to discharge from any one of the storage nodes MB and M and charge to the other of the storage nodes MB and M, so that data writing to the storage nodes MB and M can be normally performed.

Fourteenth Embodiment

Figure 17:
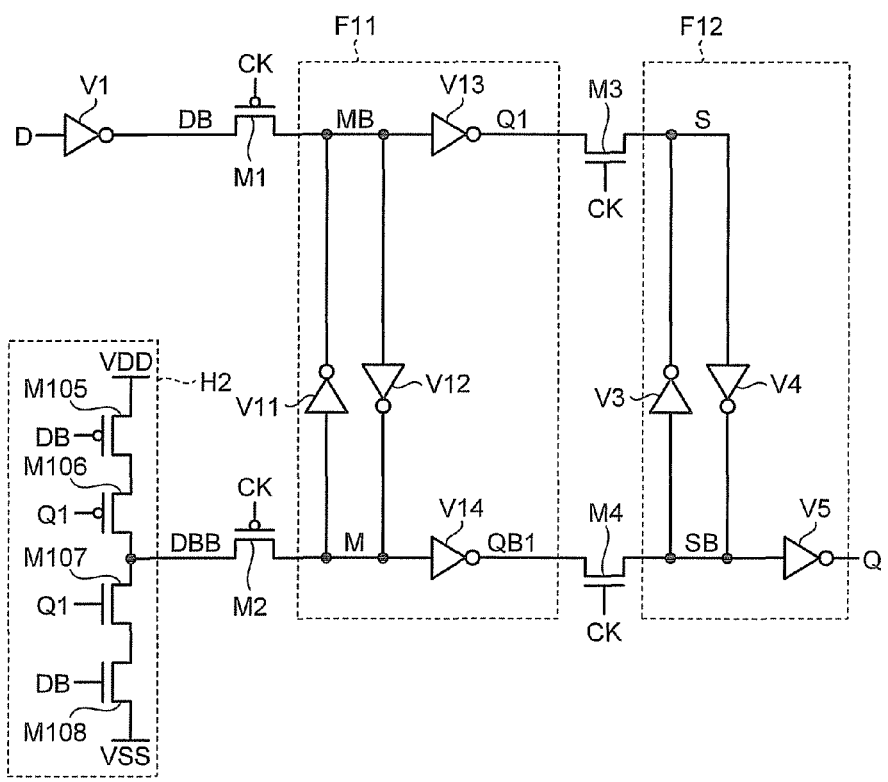
FIG. 17 is a circuit diagram illustrating a schematic configuration of a semiconductor integrated circuit according to a fourteenth embodiment of the present invention.

FIG. 17 is a circuit diagram illustrating a schematic configuration of a semiconductor integrated circuit according to the fourteenth embodiment of the present invention. In the semiconductor integrated circuit shown in FIG. 17, the protection circuit H2 shown in FIG. 15 is provided instead of the inverter V2 shown in FIG. 1. The protection circuit H2 is provided only on the side of the storage node M, so that even when there is the timing difference in the state change between the data signal D and the inverted data signal DB, it is possible to prevent the charging paths to the storage nodes MB and M from being formed at the same time and prevent the discharging paths from the storage nodes MB and M from being formed at the same time. Thus, data writing to the storage nodes MB and M can be normally performed.

Fifteenth Embodiment

Figure 18:
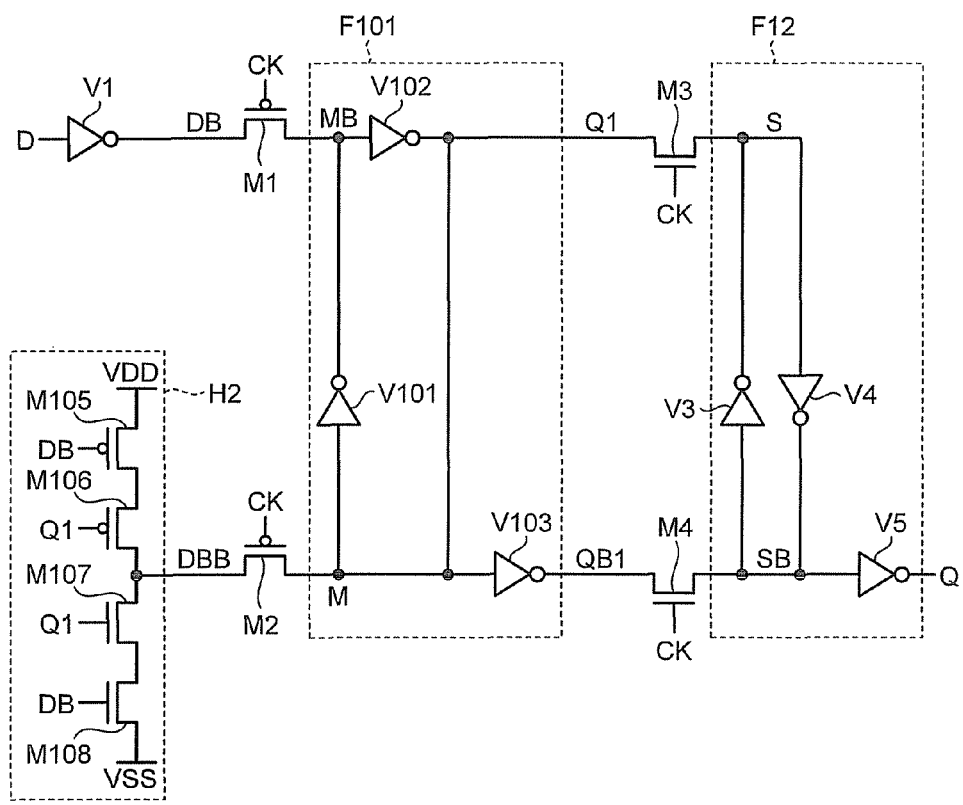
FIG. 18 is a circuit diagram illustrating a schematic configuration of a semiconductor integrated circuit according to a fifteenth embodiment of the present invention.

FIG. 18 is a circuit diagram illustrating a schematic configuration of a semiconductor integrated circuit according to the fifteenth embodiment of the present invention. In the semiconductor integrated circuit shown in FIG. 18, the state-holding circuit F11 shown in FIG. 17 is replaced by a state-holding circuit F101. The state-holding circuit F101 includes inverters V101 to V103.

The output of the inverter V101 is connected to the input of the inverter V102 to constitute the storage node MB, and the output of the inverter V102 is connected to the input of the inverter V101 to constitute the storage node M.

The storage node MB is connected to the drain of the PMOS transistor M1 and is connected to the drain of the NMOS transistor M3 via the inverter V91. The storage node M is connected to the drain of the PMOS transistor M2 and is connected to the drain of the NMOS transistor M4 via the inverter V103.

The inverter V102 performs the data hold and transmission by the inverters V12 and V13 shown in FIG. 17, the inverter V101 performs the data hold by the inverter V11 shown in FIG. 17, and the inverter V103 performs the data transmission by the inverter V14 shown in FIG. 17. The fifteenth embodiment can also obtain the effect similar to that in the fourteenth embodiment.

Sixteenth Embodiment

Figure 19:
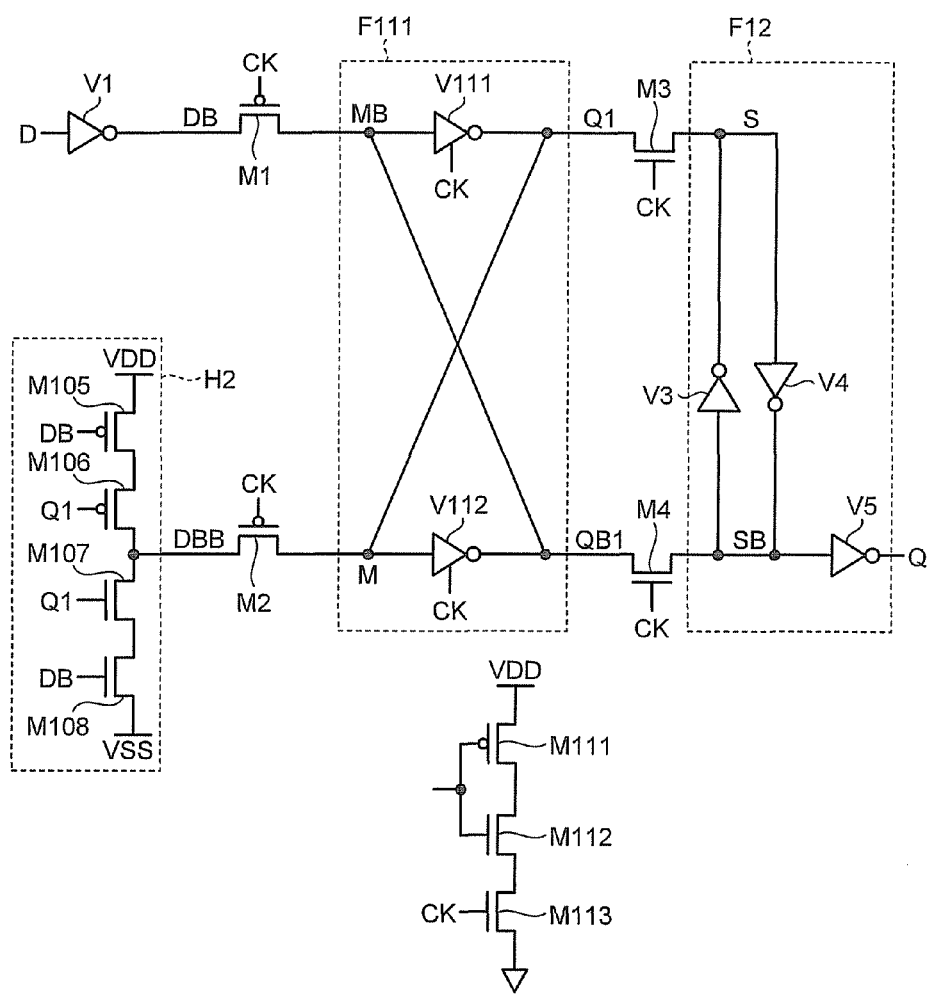
FIG. 19 is a circuit diagram illustrating a schematic configuration of a semiconductor integrated circuit according to a sixteenth embodiment of the present invention.

FIG. 19 is a circuit diagram illustrating a schematic configuration of a semiconductor integrated circuit according to the sixteenth embodiment of the present invention. In the semiconductor integrated circuit shown in FIG. 19, the state-holding circuit F11 shown in FIG. 17 is replaced by a state-holding circuit F111. The state-holding circuit F111 includes clocked gates V111 and V112. The output of the clocked gate V111 is connected to the input of the clocked gate V112 to constitute the storage node M, and the output of the clocked gate V112 is connected to the input of the clocked gate V111 to constitute the storage node MB. The storage node MB is connected to each drain of the PMOS transistor M1 and the NMOS transistor M4. The storage node M is connected to each drain of the PMOS transistor M2 and the NMOS transistor M3.

In the clocked gates V111 and V112, a PMOS transistor M111 and NMOS transistors M112 and M113 that are connected in series are provided. The gate of the PMOS transistor M111 and the gate of the NMOS transistor M112 are connected in common, and the clock signal CK is input to the gate of the NMOS transistor M113.

When the clock signal CK is in a low level, the NMOS transistor M113 is off. Therefore, the low-level potential VSS is not supplied to both of the storage nodes M and MB, so that the potentials of the storage nodes M and MB become undetermined.

On the other hand, when the clock signal CK is in a low level, the PMOS transistors M1 and M2 are on. Therefore, the inverted data signal DB is applied to the storage node MB and the data signal DBB is applied to the storage node M. The potential of the storage node MB is uniquely determined in accordance with the level of the inverted data signal DB and the potential of the storage node M is uniquely determined in accordance with the level of the data signal DBB.

Then, when the clock signal CK transitions from a low level to a high level, the NMOS transistor M113 is turned on. Therefore, the low-level potential VSS is supplied to the storage nodes M and MB, and the states in accordance with the levels of the data signal DBB and the inverted data signal DB are held in the storage nodes MB and M.

The states held in the storage nodes M and MB are output as the output signal Q1 and the output inverted signal QB1 to the storage nodes S and SB via the NMOS transistors M3 and M4, respectively.

The holding capability of the states in the storage nodes M and MB can be lowered while the data signal DBB and the inverted data signal DB are applied to the storage nodes M and MB, respectively, by constituting the state-holding circuit F111 by the clocked gates V111 and V112, so that the states held in the storage nodes M and MB can be easily transitioned.

Moreover, it is possible to cause the state-holding circuit F111 to hold or transfer the state by inputting the clock signal CK to each gate of the PMOS transistors M1 and M2 and the NMOS transistors M3, M4, and M113. Therefore, there is no need to additionally provide a clock buffer that generates the clock inverted signal CKB from the clock signal CK, so that the power consumption can be reduced by the amount consumed by the clock buffer.

In the present embodiment in FIG. 19, explanation is given for the method in which the NMOS transistor M113 is connected to the source of the NMOS transistor M112; however, the NMOS transistor M113 can be connected to the source of the PMOS transistor M111 or the NMOS transistor M113 can be inserted between the PMOS transistor M111 and the NMOS transistor M112.

Seventeenth Embodiment

Figure 20:
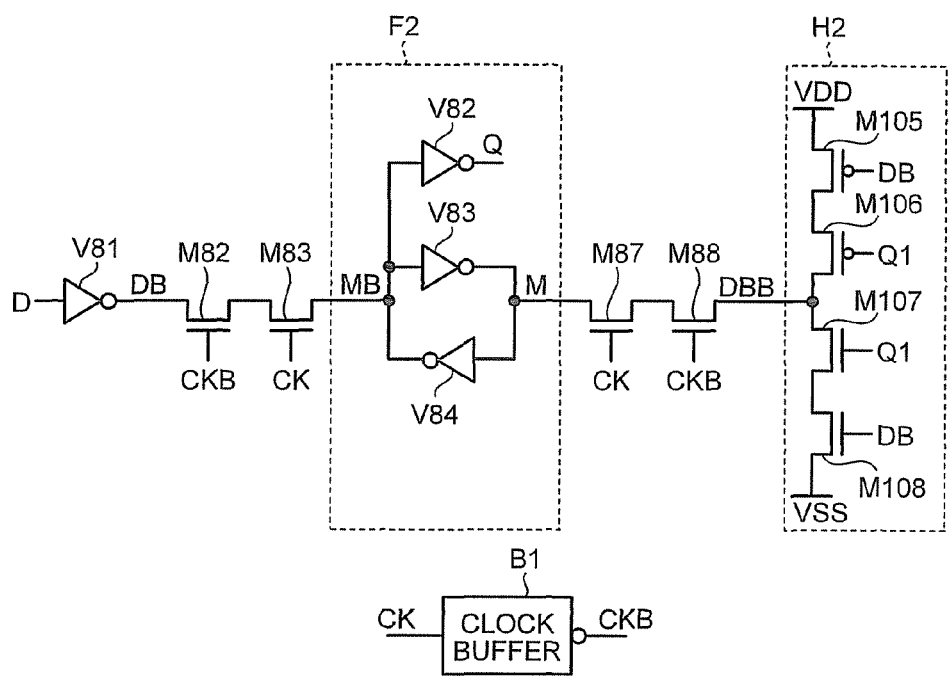
FIG. 20 is a circuit diagram illustrating a schematic configuration of a semiconductor integrated circuit according to a seventeenth embodiment of the present invention.

FIG. 20 is a circuit diagram illustrating a schematic configuration of a semiconductor integrated circuit according to the seventeenth embodiment of the present invention. In the semiconductor integrated circuit shown in FIG. 20, the state-holding circuit F1 shown in FIG. 13 is replaced by a state-holding circuit F2. The state-holding circuit F2 includes the inverters V82 to V84.

The output of the inverter V83 is connected to the input of the inverter V84 to constitute the storage node M, and the output of the inverter V84 is connected to the input of the inverter V83 to constitute the storage node MB.

Therefore, the state of the state-holding circuit F2 can be changed only during the period defined by the delay time Td of the clock buffer B1, thus enabling to perform a pulse trigger operation. Thus, even when the storage nodes MB and M are pulled down and pulled up by using the inverted data signal DB and the data signal DBB, the operation speed can be improved.

Moreover, the protection circuit H2 is provided on the side of the storage node M, so that even when there is the timing difference in the state change between the data signal DBB and the inverted data signal DB, data writing to the storage nodes MB and M can be normally performed.

The embodiments of the present invention are explained as described above; however, the circuit according to the embodiments of the present invention can be used, for example, in a high performance LSI such as an LSI for digital terrestrial broadcast reception. Typically, in the high performance LSI, a flip-flop circuit occupies about 30% to 40% of the whole. Therefore, the switching power or the operation power can be reduced by applying the flip-flop circuit in the present embodiments to the high performance LSI.

Moreover, in the case where all of the circuit blocks in an LSI operate, even when a technology such as power shutdown cannot be used, the operation power can be reduced by using the flip-flop circuit in the present embodiments.

Furthermore, the flip-flop circuit in the present embodiments can be mixed with other power-saving technologies such as clock gating, power shutdown, multiple supply voltages, or dynamic voltage frequency scaling (DVFS).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first inverter;
   a first first-conductive transistor that is connected to an input of the first inverter, and inputs a first data signal to the first inverter according to a first level of a clock signal;
   a first second-conductive transistor that is connected to an output of the first inverter, and turns on according to a second level of the clock signal;
   a second inverter;
   a second first-conductive transistor that is connected to an input of the second inverter, and inputs a second data signal to the second inverter according to a first level of a clock signal;
   a second second-conductive transistor that is connected to an output of the second inverter, and turns on according to the second level of the clock signal;
   a third first-conductive transistor that is inserted between an output of the first inverter and an input of the second inverter, and turns on according to the first level of the first data signal; and
   a third second-conductive transistor that is connected in parallel with the third first-conductive transistor, and turns on according to the second level of the first data signal.

2. The semiconductor integrated circuit according to claim 1, further comprising:
   a forth first-conductive transistor that is inserted between an input of the first inverter and an output of the second inverter, and turns on according to the first level of the second data signal; and
   a forth second-conductive transistor that is connected in parallel with the forth first-conductive transistor, and turns on according to the second level of the second data signal.

3. The semiconductor integrated circuit according to claim 1, wherein
   the first data signal is input to the first first-conductive transistor; and
   the second data signal is input to the second first-conductive transistor.

4. The semiconductor integrated circuit according to claim 3, wherein
   the first data signal is an inverted signal of the second data signal.

5. The semiconductor integrated circuit according to claim 1, wherein
   the first inverter outputs a first output signal; and
   the second inverter outputs a second output signal.

6. The semiconductor integrated circuit according to claim 5, wherein
   the second output signal is an inverted signal of the first output signal.

7. A semiconductor integrated circuit comprising:
   a first inverter;
   a first first-conductive transistor that is connected to an input of the first inverter, and a clock signal being input to a gate of the first first-conductive transistor;
   a first second-conductive transistor that is connected to an output of the first inverter, and the clock signal being input to a gate of the first second-conductive transistor;
   a second inverter;
   a second first-conductive transistor that is connected to an input of the second inverter, and the clock signal being input to a gate of the second first-conductive transistor;
   a second second-conductive transistor that is connected to an output of the second inverter, and the clock signal being input to a gate of the second second-conductive transistor;
   a third first-conductive transistor that is inserted between an output of the first inverter and an input of the second inverter, and a first data signal being input to a gate of the third first-conductive transistor; and
   a third second-conductive transistor that is connected in parallel with the third first-conductive transistor, and the first data signal being input to a gate of the third second-conductive transistor.

8. The semiconductor integrated circuit according to claim 7, further comprising:
   a forth first-conductive transistor that is inserted between an input of the first inverter and an output of the second inverter, and a second data signal being input to a gate of the forth first-conductive transistor; and
   a forth second-conductive transistor that is connected in parallel with the forth first-conductive transistor, and the second data signal being input to a gate of the forth second-conductive transistor.

9. The semiconductor integrated circuit according to claim 8, wherein
   the first data signal is input to the first first-conductive transistor; and
   the second data signal is input to the second first-conductive transistor.

10. The semiconductor integrated circuit according to claim 9, wherein
    the first data signal is an inverted signal of the second data signal.

11. The semiconductor integrated circuit according to claim 7, wherein
    the first inverter outputs a first output signal; and
    the second inverter outputs a second output signal.

12. The semiconductor integrated circuit according to claim 11, wherein
    the second output signal is an inverted signal of the first output signal.

13. A semiconductor integrated circuit comprising:
a state holding circuit that inputs an output of one inverter to another inverter with each other;
a data terminal that a data signal is input to;
a first first-conductive transistor that transmits a state of the data signal to an input of the one inverter when a clock signal is in a first level;
a second first-conductive transistor that is inserted between an output of the one inverter and an input of the other inverter, and turns on when the data signal is in a first level; and
a first second-conductive transistor that is connected in parallel with the second first-conductive transistor, and turns on when the data signal is in a second level, wherein
a gate of the second first-conductive transistor or a gate of the first second-conductive transistor is directly connected to the data terminal.

14. The semiconductor integrated circuit according to claim 13, wherein
a gate of the second first-conductive transistor is directly connected to a gate of the first second-conductive transistor.

15. The semiconductor integrated circuit according to claim 13, wherein
a gate of the second first-conductive transistor is directly connected to the data terminal.

* * * * *